United States Patent
Strode et al.

(10) Patent No.: US 9,059,734 B1
(45) Date of Patent: Jun. 16, 2015

(54) SYSTEMS AND METHODS FOR CAPACITIVE DIGITAL TO ANALOG CONVERTERS

(71) Applicant: Maxim Integrated Products, Inc., San Jose, CA (US)

(72) Inventors: Jonathan Strode, Los Altos, CA (US); Wolfgang Himmelbauer, Palo Alto, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/197,604

(22) Filed: Mar. 5, 2014

Related U.S. Application Data

(60) Provisional application No. 61/875,804, filed on Sep. 10, 2013.

(51) Int. Cl.
*H03M 1/34* (2006.01)
*H03M 1/66* (2006.01)
*H03M 1/46* (2006.01)

(52) U.S. Cl.
CPC . *H03M 1/66* (2013.01); *H03M 1/46* (2013.01)

(58) Field of Classification Search
CPC ........... H03M 1/66; H03M 1/46; H03M 1/38; H03M 1/403

USPC .......... 341/155, 144, 163, 172, 153
See application file for complete search history.

(56) References Cited

U.S. PATENT DOCUMENTS

| | | | |
|---|---|---|---|
| 7,705,755 B2 * | 4/2010 | Yang et al. | 341/120 |
| 7,965,218 B2 * | 6/2011 | Ohnhaeuser et al. | 341/172 |
| 8,040,271 B2 * | 10/2011 | Furuta et al. | 341/172 |
| 2011/0032134 A1 * | 2/2011 | Cho et al. | 341/144 |

* cited by examiner

*Primary Examiner* — Peguy Jean Pierre

(57) ABSTRACT

A capacitive digital to analog converter (DAC) includes: a first capacitor including a first terminal and a second terminal, the second terminal connected to a common node; a first switching device: including a third terminal connected to the first terminal of the first capacitor; including fourth, fifth, sixth, and seventh terminals that are connected to first, second, third, and fourth reference potentials, respectively; and selectively connecting the third terminal to the fourth, fifth, sixth, and seventh terminals; a second capacitor including an eighth terminal and a ninth terminal, the ninth terminal connected to the common node; and a second switching device: including a tenth terminal connected to the eighth terminal of the second capacitor; including eleventh, twelfth, thirteenth, and fourteenth terminals that are connected to the first, second, third, and fourth reference potentials, respectively; and selectively connecting the tenth terminal to the eleventh, twelfth, thirteenth, and fourteenth terminals.

20 Claims, 4 Drawing Sheets

SYSTEMS AND METHODS FOR CAPACITIVE DIGITAL TO ANALOG CONVERTERS

CROSS-REFERENCE TO RELATED APPLICATIONS

This application claims the benefit of U.S. Provisional Application No. 61/875,804, filed on Sep. 10, 2013. The entire disclosure of the application referenced above is incorporated herein by reference.

FIELD

The present disclosure relates to capacitive digital to analog converters (DACs) and more particularly to capacitive DACs of analog to digital converters (ADCs).

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Analog-to-digital converters (ADCs) convert samples of an analog input signal into digital values corresponding to the samples. Various types of ADCs are available, such as successive-approximation-register (SAR) ADCs, Sigma-Delta ADCs, and pipelined ADCs. SAR ADCs, Sigma-Delta ADCs, pipelined ADCs, and other types of ADCs include a switched-capacitor digital-to-analog converter (DAC) ("a capacitive DAC") as a core building block.

For example, in a SAR ADC, during a conversion process, a capacitive DAC is periodically switched to generate analog voltage levels for comparison with a sampled input signal as part of a successive approximation process. Specifically, inputs of the capacitive DAC are successively switched to either a reference voltage $V_{REF}$ or ground, thereby demanding charge from the reference voltage $V_{REF}$. The amount of charge drawn by the capacitive DAC from the reference voltage depends on the input signal (i.e., input voltage) and is a function of the code applied to the capacitive DAC during the successive approximation process. Accordingly, the capacitive DAC represents a code-dependent load that draws a code-dependent load current from the reference voltage.

SUMMARY

In a feature, a capacitive digital to analog converter (DAC) includes: a first capacitor, a first switching device, a second capacitor, and a second switching device. The first capacitor includes a first terminal and a second terminal, the second terminal connected to a common node. The first switching device: includes a third terminal connected to the first terminal of the first capacitor; includes fourth, fifth, sixth, and seventh terminals that are connected to first, second, third, and fourth reference potentials, respectively; and selectively connects the third terminal to one of the fourth, fifth, sixth, and seventh terminals. The second capacitor includes an eighth terminal and a ninth terminal, the ninth terminal connected to the common node. The second switching device: includes a tenth terminal connected to the eighth terminal of the second capacitor; includes eleventh, twelfth, thirteenth, and fourteenth terminals that are connected to the first, second, third, and fourth reference potentials, respectively; and selectively connects the tenth terminal to one of the eleventh, twelfth, thirteenth, and fourteenth terminals.

In further features, a successive-approximation-register (SAR) ADC includes: the capacitive DAC; a comparator module that compares a first voltage of a sample of an analog signal with a second voltage at the common node; and a SAR module that controls the first and second switching devices based on the comparison.

In further features, the SAR module: controls the first switching device to connect the third terminal to the fourth terminal at a first time; and, when the second voltage is less than the first voltage at a second time that is after the first time, selectively controls the first switching device to connect the third terminal to the fifth terminal.

In further features, the first and second reference potentials are approximately equal.

In further features, when the second voltage is greater than the first voltage at the second time, the SAR module controls the first switching device to connect the third terminal to the sixth terminal.

In further features, after controlling the first switching device to connect the third terminal to the sixth terminal, the SAR module selectively controls the first switching device to connect the third terminal to the seventh terminal.

In further features, the third and fourth reference potentials are approximately equal.

In further features, the SAR module: controls the second switching device to connect the tenth terminal to the eleventh terminal at a third time that is after the second time; when the second voltage is less than the first voltage at a fourth time that is after the third time, selectively controls the second switching device to connect the tenth terminal to the twelfth terminal; when the second voltage is greater than the first voltage at the fourth time, controls the second switching device to connect the tenth terminal to the thirteenth terminal; and, after controlling the second switching device to connect the tenth terminal to the thirteenth terminal, controls the second switching device to connect the tenth terminal to the fourteenth terminal. The first reference potential is approximately equal to the second reference potential. The third reference potential is approximately equal to the fourth reference potential.

In further features, the first and second capacitors provide a radix of less than 2.

In further features, the first and second capacitors are non-binary weighted.

In further features, the first and second capacitors are binary weighted.

In further features, the capacitive DAC further includes: N additional switching devices that each include terminals that are connected to the first, second, third, and fourth reference potentials, respectively, and that include output terminals; and N additional capacitors that are connected between the output terminals of the N additional switching devices, respectively, and the common node. N is an integer greater than zero.

In a feature, a method of controlling switching of a capacitive digital to analog converter (DAC) includes: selectively connecting first, second, third, and fourth reference potentials to a first terminal of a first capacitor of the DAC, wherein a second terminal of the first capacitor is connected to a common node of the DAC; and selectively connecting the first, second, third, and fourth reference potentials to a third terminal of a second capacitor of the DAC, respectively, wherein a fourth terminal of the second capacitor is connected to the common node of the DAC.

In further features, the method further includes controlling the connections of the first, second, third, and fourth reference potentials to the first terminal of the first capacitor of the DAC and the connections of the first, second, third, and fourth reference potentials to the third terminal of the second capacitor of the DAC based on comparisons of a first voltage of a sample of an analog signal with a second voltage at the common node.

In further features, the method further includes: connecting the first reference potential to the first terminal of the first capacitor at a first time; and, when the second voltage is less than the first voltage at a second time that is after the first time, selectively connecting the second reference potential to the first terminal of the first capacitor.

In further features, the first and second reference potentials are approximately equal.

In further features, the method further includes, when the second voltage is greater than the first voltage at the second time, connecting the third reference potential to the first terminal of the first capacitor.

In further features, the method further includes, after connecting the third reference potential to the first terminal of the first capacitor, selectively connecting the fourth reference potential to the first terminal of the first capacitor.

In further features, the third and fourth reference potentials are approximately equal.

In further features, the method further includes: connecting the first reference potential to the third terminal of the second capacitor at a third time that is after the second time; when the second voltage is less than the first voltage at a fourth time that is after the third time, selectively connecting the second reference potential to the third terminal of the second capacitor; when the second voltage is greater than the first voltage at the fourth time, connecting the third reference potential to the third terminal of the second capacitor; and, after connecting the third reference potential to the third terminal of the second capacitor, selectively connecting the fourth reference potential to the third terminal of the second capacitor. The first reference potential is approximately equal to the second reference potential, and the third reference potential is approximately equal to the fourth reference potential.

In further features, the first and second capacitors provide a radix of less than 2.

In further features, the first and second capacitors are non-binary weighted.

In further features, the first and second capacitors are binary weighted.

In further features, the method further includes selectively connecting the first, second, third, and fourth reference potentials to input terminals of N additional capacitors of the DAC, wherein output terminals of the N additional capacitors are connected to the common node of the DAC. N is an integer greater than zero.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

An N-bit capacitive DAC includes N inputs that are switched to convert a digital input into an analog output. For example, successive approximation register (SAR) analog to digital converters (ADCs) include capacitive DACs. Elements of a capacitive DAC of an SAR ADC are successively switched to a reference voltage $V_{REF}$ for comparison of the analog output of the DAC with a sample of an analog input. The SAR ADC determines whether to keep elements connected to the reference voltage or to switch the elements to ground based on the comparisons in an effort to adjust the output of the DAC toward the sample.

However, a load current corresponding to the states of the elements of the DAC will cause fluctuations in the reference voltage. The voltage fluctuations may degrade linearity performance of the SAR ADC and/or the capacitive DAC. Additionally, a transient change occurs in the reference voltage each time that an element of the DAC is connected to the reference voltage. Such transients therefore affect every other element of the DAC that is connected to the reference voltage and may therefore affect settling of the DAC.

A capacitive DAC of the present disclosure therefore generates the DAC output using both first and second reference voltages (VRef1 and VRef2). The first and second references voltages are controlled to be approximately equal or equal, such as approximately 2.5 Volts (V) or another suitable voltage.

Elements of the capacitive DAC of the SAR ADC are successively switched to the first reference voltage VRef1 for comparison of the analog output of the DAC with a sample of an analog input. If, based on the comparison of the resulting output of the DAC with the sample, an element of the DAC is to be maintained connected to a reference voltage, that element is later transitioned to the second reference voltage VRef2. A lesser load current is therefore drawn from the second reference voltage. Additionally, transients have a lesser effect on the output of the DAC.

Figure 1:
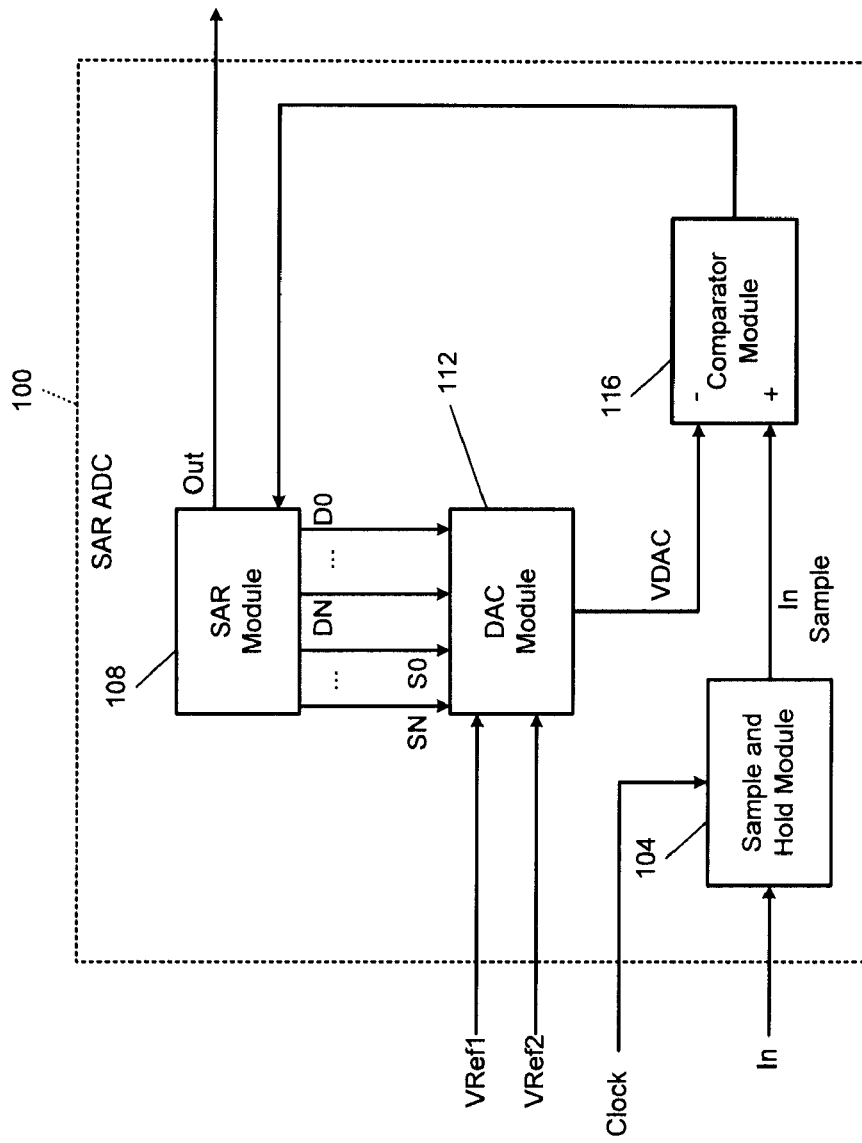
FIG. 1 is a functional block diagram of an example successive-approximation-register (SAR) analog-to-digital converter (ADC) according to the present disclosure.

Referring now to FIG. 1, a functional block diagram of an example successive-approximation-register (SAR) analog to digital converter (ADC) 100 is presented. The SAR ADC 100 includes a sample and hold module 104, a SAR module 108, a digital to analog converter (DAC) module 112, and a comparator module 116.

The sample and hold module 104 receives an analog input voltage (in) for conversion and samples the input voltage according to a clock signal (Clock). The sample and hold module 104 outputs (voltage) samples of the input voltage to a first input of the comparator module 116. For each voltage sample, the SAR module 108 generates a digital output voltage (Out) corresponding to the voltage sample. The sample and hold module 104 shown in FIG. 1 can be implemented within the DAC module 112. For example, some capacitive DACs provide a sample and hold function.

The SAR module 108 includes an N-bit register. The values of the N-bit register (D0, D1, . . . DN) are output to the DAC module 112 as control signals. While an example where N=8 will be shown and discussed, N is an integer greater than one and may be another suitable value, such as 2, 4, 16, 32, 64, 128, 256, etc.

The DAC module 112 includes a capacitive DAC that converts the N-bit input received from the SAR module 108 into a (analog) DAC output voltage that is output to the comparator module 116. While the present disclosure is discussed in terms of the SAR ADC 100, the present disclosure is also applicable to capacitive DACs used in other types of systems and devices.

The comparator module 116 generates an output indicative of whether the DAC output is less than the voltage sample. For example, the comparator module 116 may set its output to digital 1 (logic high) when the DAC output is less than the voltage sample and set its output to digital 0 (logic low) when the DAC output is greater than the voltage sample.

The SAR module 108 performs a successive approximation process to convert a given voltage sample into the corresponding digital output. The successive approximation process will now be discussed. Initially, the SAR module 108 may set each of the bits of the N-bit register to digital 0. The SAR module 108 may next set a most significant bit (MSB) of the N-bit register to digital 1 and leave the remainder of the N-bits (i.e., all other bits) at digital 0. This may cause the DAC output to be approximately a midscale value between a maximum possible value of the DAC output and a minimum possible value of the DAC output.

The SAR module 108 determines whether to keep the MSB of the N-bit register at digital 1 based on the output of the comparator module 116. For example, the SAR module 108 keeps the MSB of the N-bit register at digital 1 when the comparator module 116 outputs digital 1 (indicating that the DAC output is less than the voltage sample). When the comparator module 116 outputs digital 0 (indicating that the DAC output is greater than the voltage sample), the SAR module 108 may set the MSB of the N-bit register to digital 0.

The SAR module 108 may then set a next most significant bit (based on a predetermined order of significance) of the N-bit register to digital 1 and maintain the states of the other bits. If the resulting DAC output is less than the voltage sample, the SAR module 108 may keep that bit at digital 1; otherwise, the SAR module 108 may set that bit to digital 0. The SAR module 108 may continue this process of setting a bit of the N-bit register to digital 1 and determining whether to keep or reject the digital 1 for that bit based on the output of the comparator module 116 for each of the bits of the N-bit register in the predetermined order of significance.

Once each of the N bits has been addressed, the DAC module 112 produces a DAC output that is as close to the voltage sample as possible, and the N-bit output of the SAR module 108 is a digital representation of the voltage sample. The SAR module 108 generates the digital output corresponding to the voltage sample based on the states of the bits of the N-bit register.

The DAC module 112 could generate the DAC output using only a single reference voltage (VRef1). In order to accurately convert a voltage sample to the corresponding digital output, the reference voltage should be as stable (constant) as possible. However, a load current that is dependent upon the N-bit output of the SAR module 108 will cause fluctuations in the reference voltage. The voltage fluctuations may degrade linearity performance of the SAR ADC 100.

Additionally, a transient change occurs in the reference voltage each time that one of the N-bits is switched to digital 1. This transient affects every other element of the DAC module 112 that is connected to the reference voltage (corresponding to each digital 1) and may therefore affect settling of the DAC module 112. Settling may refer to the period necessary for the DAC output to reach a stable value in response to a change in a given one of the N-bits to digital 1.

The DAC module 112 of the present disclosure therefore generates the DAC output using both first and second reference voltages (VRef1 and VRef2). The first and second references voltages are controlled to be approximately equal or equal, such as approximately 2.5 Volts (V) or another suitable voltage. When a given one of the N-bits is set to digital 1, the corresponding element of the DAC module 112 is connected to the first reference voltage. The first reference voltage is therefore used to charge the capacitor of that element of the DAC module 112.

Later, if that one of the N-bits is to be kept at digital 1 (based on the output of the comparator module 116), the element of the DAC module 112 is connected to the second reference voltage. In this manner, the transient effects of the conversion process have a lesser effect on the second reference voltage and the DAC output. More specifically, since the first reference voltage is used to charge the capacitors, the second reference voltage is used to a lesser extent to charge the capacitors that are to remain connected to a reference voltage. A minimal load current is therefore drawn from the second reference voltage, and the second reference voltage is less affected by later transitions performed during the successive approximation process.

Figure 2A:
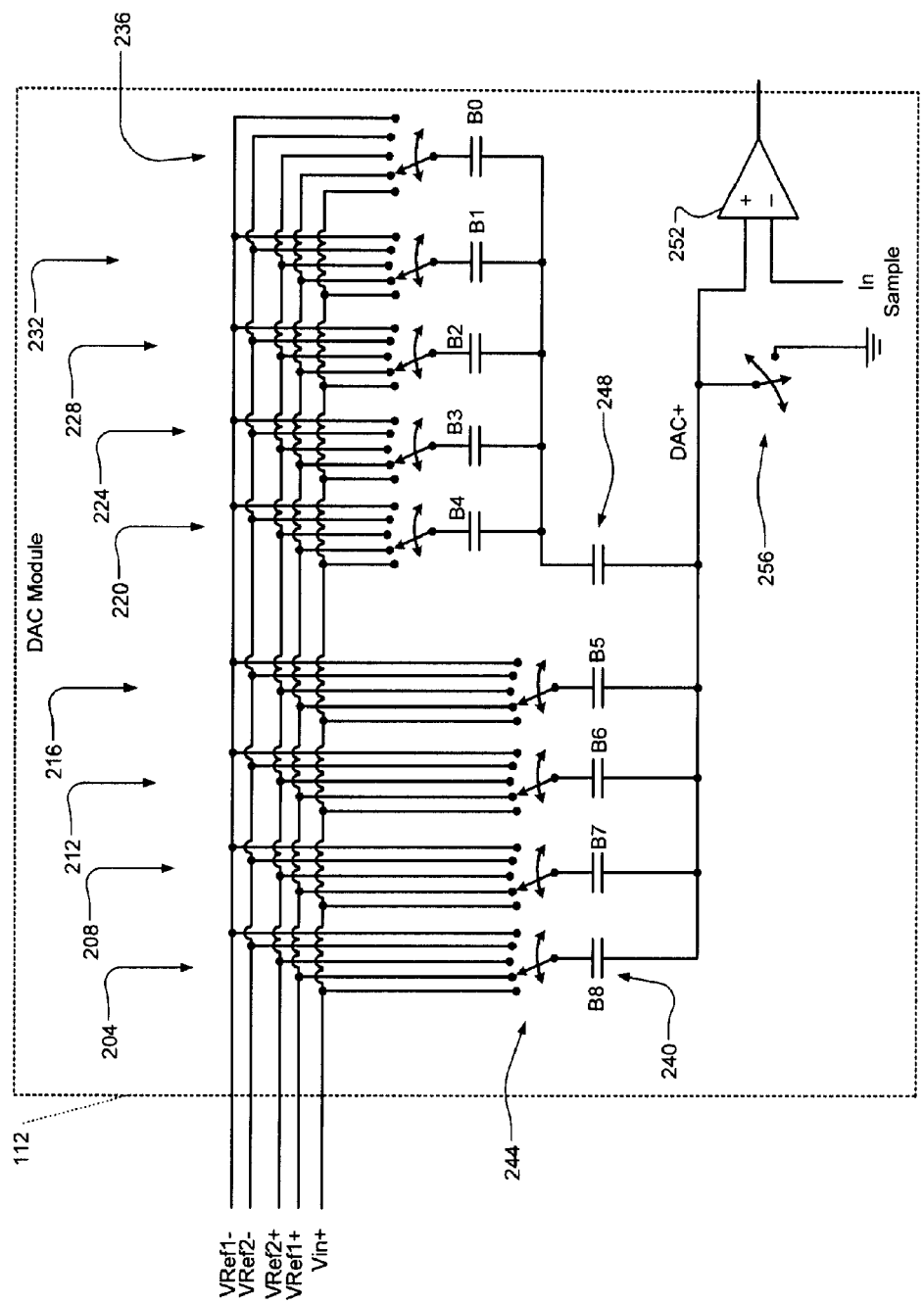
FIGS. 2A-2B are a functional block diagrams of example capacitive digital-to-analog converter (DAC) modules according to the present disclosure.

Referring now to FIG. 2A, a functional block diagram of an example implementation of the DAC module 112 is presented. As stated above, the DAC module 112 includes a capacitive DAC. The capacitive DAC includes an array of N elements, such as elements 204, 208, 212, 216, 220, 224, 228, and 232. The capacitive DAC may also include one or more additional elements and/or components, such as additional element 236.

Each element includes a capacitor and a switching device. For example, element 204 includes capacitor 240 and switching device 244. Each switching device includes a first terminal, a second terminal, a third terminal, and a fourth terminal. The first terminal is connected to a first reference potential (Vref1+), the second terminal is connected to a second reference potential (Vref1−), the third terminal is connected to a third reference potential (VRef2+), and the fourth terminal is connected to a fourth reference potential (VRef2−). As an example only, the first reference potential may be approximately +2.5 V, the third reference potential may be approximately +2.5 V, and the second and fourth reference potentials may be approximately 0 V (e.g., a ground potential). Other suitable reference potentials may be used in different implementations. For example, the second and fourth reference potentials may be approximately −2.5 V in other implementations. The first and third references potentials are controlled to be approximately equal or equal, and the second and fourth reference potentials are controlled to be approximately equal or equal. The switching devices may include, for example, metal oxide semiconductor field effect transistors (MOSFETs) (e.g., p-type MOSFETS) or another suitable type of switching device.

Each switching device also includes a fifth terminal. Based on the outputs from the SAR module 108, respectively, the switching devices selectively connect their fifth terminals with one of their first, second, third, and fourth terminals. The switching devices may also include a sixth terminal that is connected to an input voltage (Vin+) and may selectively connect their sixth terminals to the fifth terminal based on signals from the SAR module 108. For example, the switching devices may connect their sixth terminals to their fifth terminals to implement the sample function. While the switching devices are shown as single switching devices, each of the switching devices may include multiple switching devices.

The capacitor of each element is connected to the fifth terminal of that element's switching device and to a common node (DAC+). In this manner, the capacitor of an element receives the reference potential that is connected to the fifth terminal of that element's switching device. The capacitors may be non-binary weighted, and the capacitors may be selected as to provide a radix of less than 2. In various implementations, the capacitors may be binary weighted.

The DAC module 112 may also include an additional capacitor 248 that is connected between the capacitors of the elements 220-232 and the common node. The common node is connected to a comparator module 252. The DAC module 112 may include a ground switch 256 that can connect the common node to a ground reference potential. The comparator module 252 generates an output based on a comparison of the voltage at the common node and the voltage sample.

The second input of the comparator module 252 may be connected to a ground reference potential, as shown in FIG. 2A, or to another suitable reference potential, such as the voltage sample. The SAR module 108 controls the states of the N-bit register based on the output of the comparator module 252, as discussed above.

Figure 2B:
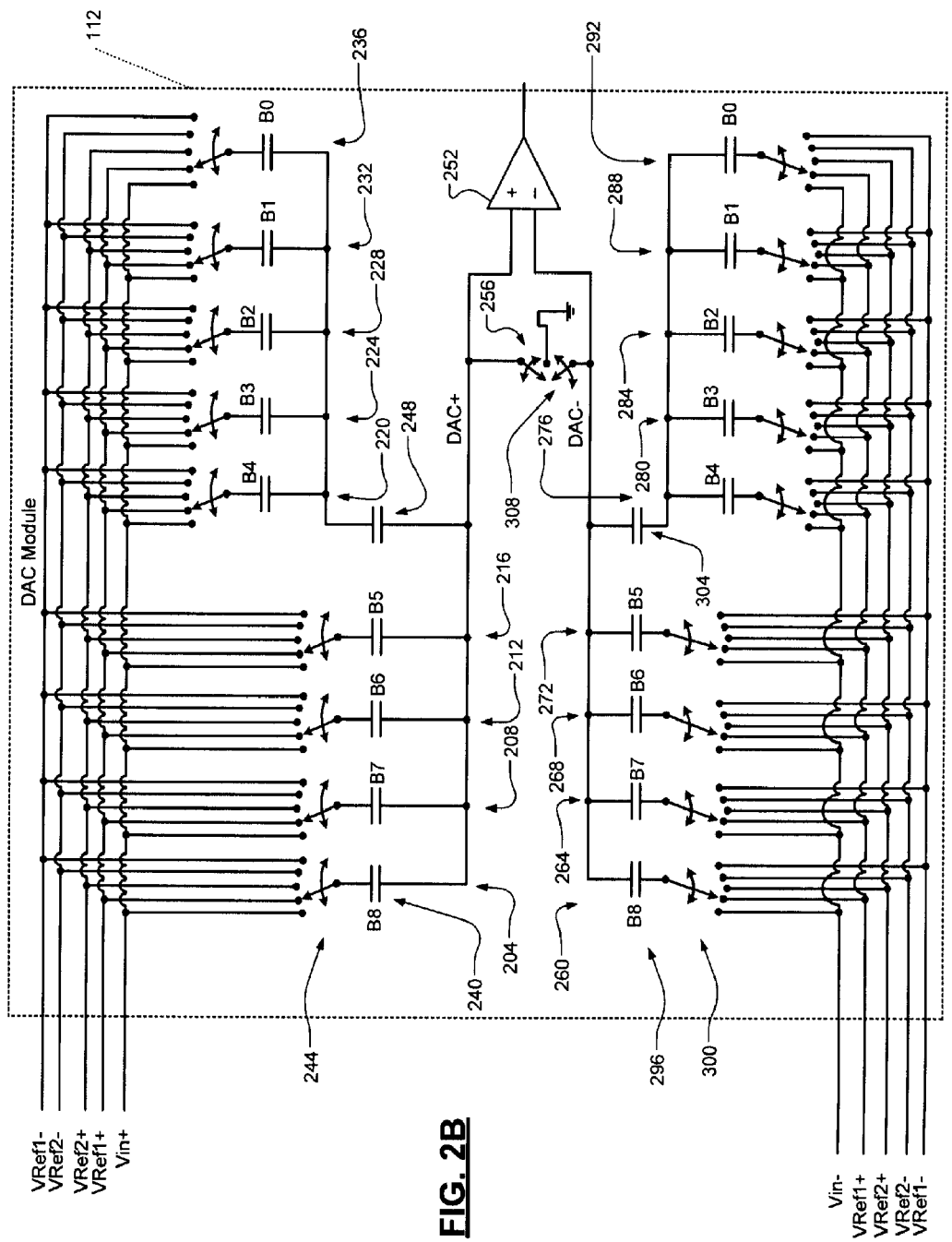

FIG. 2B is a functional block diagram of another example implementation of the DAC module 112. Referring now to FIG. 2B, the capacitive DAC may include a second set of N elements, such as elements 260, 264, 268, 272, 276, 280, 284, and 288. The capacitive DAC may also include one or more additional elements and/or components, such as additional element 292. The elements 260-292 may be referred to as being part of the elements 204-236, respectively, in various implementations.

Each of these elements includes a capacitor and a switching device. For example, element 260 includes capacitor 296 and switching device 300. Each switching device includes a first terminal, a second terminal, a third terminal, and a fourth terminal. The first terminal is connected to the first reference potential (Vref1+), the second terminal is connected to the second reference potential (Vref1−), the third terminal is connected to the third reference potential (VRef2+), and the fourth terminal is connected to the fourth reference potential (VRef2−). For example only, these switching devices may include MOSFETs (e.g., n-type MOSFETS) or another suitable type of switching device.

Each switching device also includes a fifth terminal. Based on the outputs from the SAR module 108 (and more specifically the N-bit register), respectively, the switching devices selectively connect their fifth terminals with one of their first, second, third, and fourth terminals. The switching devices may also include a sixth terminal that is connected to an input voltage and may selectively connect their sixth terminals to the fifth terminal based on signals from the SAR module 108.

The capacitor of each element is connected to the fifth terminal of that element's switching device and to a second common node (DAC−). In this manner, the capacitor of an element receives the reference potential that is connected to the fifth terminal of that element's switching device. These capacitors may be non-binary weighted, and the capacitors may be selected as to provide a radix of less than 2. In various implementations, the capacitors may be binary weighted.

The DAC module 112 may also include an additional capacitor 304 that is connected between the capacitors of the elements 220-232 and the second common node. The second common node is connected to a second input of the comparator module 252. The DAC module 112 may include a second ground switch 308 that can connect the second common node to a ground reference potential. The comparator module 252 generates the output based on a comparison of the voltage at the first common node and the voltage at the second common node.

The switches of the elements 260-292 may be controlled, for example, complementarily to the switching devices of the elements 204-236, respectively. For example, when the switching device 244 is controlled such that its first terminal is connected to its fifth terminal, the switching device 300 may be controlled such that its second terminal is connected to its fifth terminal. In other words, when the fifth terminal of one of the switching devices 244 and 300 is connected to the first reference potential (Vref1+), the fifth terminal of the other one of the switching devices 244 and 300 is connected to the second reference potential (Vref1−).

When the switching device 244 is controlled such that its third terminal is connected to its fifth terminal, the switching device 300 may be controlled such that its fourth terminal is connected to its fifth terminal. In other words, when the fifth terminal of one of the switching devices 244 and 300 is connected to the third reference potential (Vref2+), the fifth terminal of the other one of the switching devices 244 and 300 is connected to the fourth reference potential (Vref2−). The switches of the elements 204-236 and 260-292, respectively, may be controlled similarly. This complementary control of the switches may be provided, for example, by logically inverting the signals provided to the elements 204-236 for the elements 260-292.

Referring now to FIGS. 2A and 2B, during the successive approximation process, the SAR module 108 may control each of the bits as follows in the predetermined order of significance. The SAR module 108 selectively sets the state of one of the bits of the N-bit register to digital 1 and maintains the states of the other bits. In response, the switching device of the corresponding element of the capacitive DAC may connect its first terminal with its fifth terminal such that the first reference potential (VRef1+) is connected to the capacitor of that element. The SAR module 108 determines whether to keep or reject the state of that bit based on whether the DAC output is less than the sample voltage.

If the DAC output is greater than the voltage sample, the SAR module 108 may reject the state of that bit and transition that one of the bits to digital 0. In response, the switching device of the corresponding element of the capacitive DAC connects its second terminal with its fifth terminal such that the third reference potential (VRef1−) is connected to its fifth terminal. Later, such as after one or more other bits have been addressed, the SAR module 108 will transition the switching device to connect its fourth terminal with its fifth terminal as to connect the fourth reference potential (VRef2−) to its fifth terminal.

If the DAC output is less than the voltage sample, the SAR module 108 may determine to keep that bit at digital 1. Later, such as after one or more other bits have been addressed, the SAR module 108 will transition the switching device to connect its third terminal with its fifth terminal as to connect the fourth reference potential (VRef2+) to its fifth terminal. In various implementations, the SAR module 108 may provide two signals for each switch: one signal indicating whether the first reference voltage (VRef1) or the second reference voltage (VRef2) should be used; and one signal indicating whether the positive or negative (or zero) value of that reference voltage should be used.

The SAR module 108 may address each of the bits of the N-bit register in this way. A smaller load current is therefore drawn from the second reference voltage (VRef2+ and VRef2−) and voltage fluctuations in the second reference voltage are decreased. This increases linearity performance and enables better settling of the DAC module 112. While the comparator module 252 is shown as being implemented within the DAC module 112 in FIGS. 2A and 2B, the comparator module 252 may be implemented separately from the DAC module 112 in various implementations.

Figure 3:
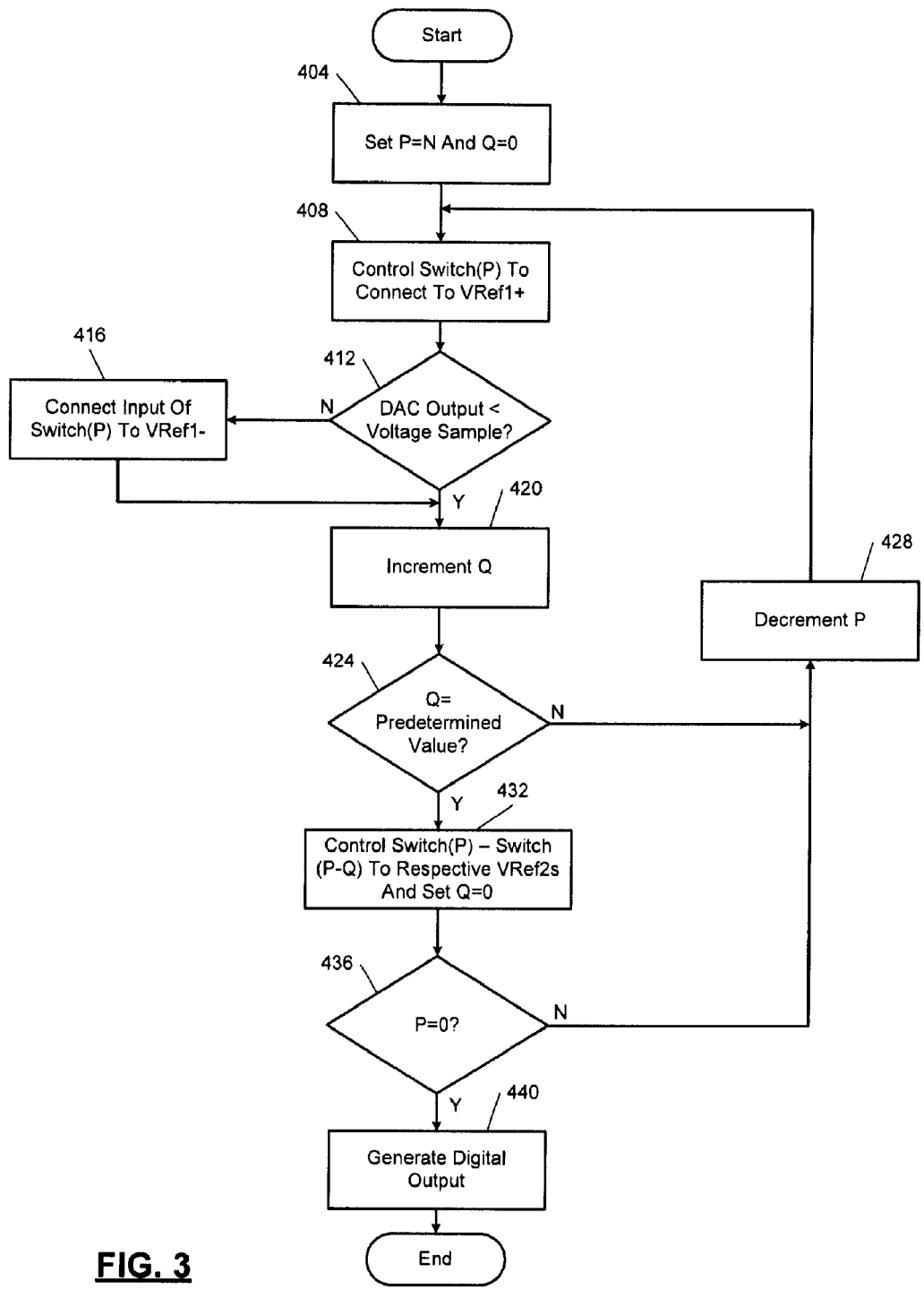
FIG. 3 is a flowchart depicting an example method of controlling switching of a capacitive DAC according to the present disclosure.

Referring now to FIG. 3, a flowchart depicting an example method of controlling conversion of a voltage sample of an analog signal is presented. Once the analog signal is sampled, control may begin with 404 where the SAR module 108 may set a first counter value (P) equal to N, the number of bits in the N-bit register and of the capacitive DAC. In the predetermined order of significance, the significance of a bit may increase as P increases. P being equal to N may therefore correspond to the MSB, P being equal to N−1 may therefore correspond to a next most significant bit after the MSB in the predetermined order of significance, and so on. The SAR module 108 may also set a second counter value (Q) equal to zero at 404. Initially, each of the N-bit registers may be set to digital 0.

At 408, the SAR module 108 may set the P-th bit of the N-bit register to digital 1, and the switching device of the P-th element of the capacitive DAC connects the first reference potential (VRef1+) to the capacitor of the P-th element. At 412, the SAR module 108 determines whether the output of the capacitive DAC is less than the voltage sample. If 412 is false, SAR module 108 may transition the P-th bit of the N-bit register to digital 0 at 416, and control may continue with 420. The switching device of the P-th element connects the second reference potential (VRef1−) to the capacitor of the P-th element in response to the P-th bit of the N-bit register being set to digital 0.

At 420, the SAR module 108 increments the second counter value (Q). The second counter value (Q) therefore tracks the number of bits that have been addressed as part of the successive approximation process for the voltage sample. The SAR module 108 may determine whether the second counter value (Q) is equal to a predetermined value at 424. If 424 is false, the SAR module 108 may decrement the first counter value (P) at 428, and control may return to 408 to address the next bit in the predetermined order of significance. The predetermined value is an integer greater than zero and may be, for example, equal to N/M, where M is an integer greater than zero, such as 1, 2, 4, or another suitable value.

If 424 is true, the SAR module 108 may set signals for the switching devices of the P-th through P-Qth elements to the corresponding polarity of the second reference voltage at 432. In this manner, the switching devices of the P-th through P-Qth elements are set to the same polarity of the second reference voltage. For example, for switching devices of the P-th through P-Qth elements that are then set to the first reference potential (VRef1+), the SAR module 108 may set the signals such that those switching devices connect the third reference potential (VRef2+) to their capacitors. Similarly, for switching devices of the P-th through P-Qth elements that are then set to the first reference potential (VRef1−), the SAR module 108 may set the signals such that those switching devices connect the fourth reference potential (VRef2−) to their capacitors.

At 436, the SAR module 108 may determine whether the first counter value (P) is equal to zero. If 436 is false, the SAR module 108 may decrement the first counter value (P) at 428, and control may return to 408 to address the next bit in the predetermined order of significance. If 436 is true, the conversion process for the voltage sample is complete, and the N-bit output of the SAR module 108 is a digital representation of the voltage sample. The SAR module 108 generates the digital output corresponding to the voltage sample based on the states of the bits of the N-bit register at 440, and control may end. While control is shown and discussed as ending, the method of FIG. 4 may be performed for each voltage sample.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:
1. A successive-approximation-register (SAR) analog to digital converter (ADC) comprising:
   a capacitive digital to analog converter (DAC) comprising:
      a first capacitor that includes a first terminal and a second terminal, the second terminal connected to a common node;
      a first switching device that:
         includes a third terminal connected to the first terminal of the first capacitor;

includes fourth, fifth, sixth, and seventh terminals that are connected to first, second, third, and fourth reference potentials, respectively; and selectively connects the third terminal to one of the fourth, fifth, sixth, and seventh terminals;

a second capacitor that includes an eighth terminal and a ninth terminal, the ninth terminal connected to the common node;

a second switching device that:

includes a tenth terminal connected to the eighth terminal of the second capacitor;

includes eleventh, twelfth, thirteenth, and fourteenth terminals that are connected to the first, second, third, and fourth reference potentials, respectively; and selectively connects the tenth terminal to one of the eleventh, twelfth, thirteenth, and fourteenth terminals;

a comparator module that compares a first voltage of a sample of an analog signal with a second voltage at the common node; and a SAR module that controls the first and second switching devices based on the comparison, wherein the SAR module:

controls the first switching device to connect the third terminal to the fourth terminal at a first time; and, when the second voltage is less than the first voltage at a second time that is after the first time, selectively controls the first switching device to connect the third terminal to the fifth terminal.

2. The SAR ADC of claim 1 wherein the first and second reference potentials are approximately equal.

3. The SAR ADC of claim 1 wherein, when the second voltage is greater than the first voltage at the second time, the SAR module controls the first switching device to connect the third terminal to the sixth terminal.

4. The SAR ADC of claim 3 wherein, after controlling the first switching device to connect the third terminal to the sixth terminal, the SAR module selectively controls the first switching device to connect the third terminal to the seventh terminal.

5. The SAR ADC of claim 4 wherein the third and fourth reference potentials are approximately equal.

6. The SAR ADC of claim 4 wherein the SAR module:

controls the second switching device to connect the tenth terminal to the eleventh terminal at a third time that is after the second time;

when the second voltage is less than the first voltage at a fourth time that is after the third time, selectively controls the second switching device to connect the tenth terminal to the twelfth terminal;

when the second voltage is greater than the first voltage at the fourth time, controls the second switching device to connect the tenth terminal to the thirteenth terminal; and, after controlling the second switching device to connect the tenth terminal to the thirteenth terminal, controls the second switching device to connect the tenth terminal to the fourteenth terminal, wherein the first reference potential is approximately equal to the second reference potential, and wherein the third reference potential is approximately equal to the fourth reference potential.

7. The SAR ADC of claim 1 wherein the first and second capacitors provide a radix of less than 2.

8. The SAR ADC of claim 1 wherein the first and second capacitors are non-binary weighted.

9. The SAR ADC of claim 1 wherein the first and second capacitors are binary weighted.

10. The SAR ADC of claim 1 further comprising:

N additional switching devices that each include terminals that are connected to the first, second, third, and fourth reference potentials, respectively, and that include output terminals; and N additional capacitors that are connected between the output terminals of the N additional switching devices, respectively, and the common node, wherein N is an integer greater than zero.

11. A method of controlling switching of a capacitive digital to analog converter (DAC), the method comprising:

selectively connecting first, second, third, and fourth reference potentials to a first terminal of a first capacitor of the DAC, wherein a second terminal of the first capacitor is connected to a common node of the DAC;

selectively connecting the first, second, third, and fourth reference potentials to a third terminal of a second capacitor of the DAC, respectively, wherein a fourth terminal of the second capacitor is connected to the common node of the DAC;

controlling the connections of the first, second, third, and fourth reference potentials to the first terminal of the first capacitor of the DAC and the connections of the first, second, third, and fourth reference potentials to the third terminal of the second capacitor of the DAC based on comparisons of a first voltage of a sample of an analog signal with a second voltage at the common node;

connecting the first reference potential to the first terminal of the first capacitor at a first time; and, when the second voltage is less than the first voltage at a second time that is after the first time, selectively connecting the second reference potential to the first terminal of the first capacitor.

12. The method of claim 11 wherein the first and second reference potentials are approximately equal.

13. The method of claim 11 wherein, when the second voltage is greater than the first voltage at the second time, connecting the third reference potential to the first terminal of the first capacitor.

14. The method of claim 13 wherein, after connecting the third reference potential to the first terminal of the first capacitor, selectively connecting the fourth reference potential to the first terminal of the first capacitor.

15. The method of claim 14 wherein the third and fourth reference potentials are approximately equal.

16. The method of claim 14 further comprising:

connecting the first reference potential to the third terminal of the second capacitor at a third time that is after the second time;

when the second voltage is less than the first voltage at a fourth time that is after the third time, selectively connecting the second reference potential to the third terminal of the second capacitor;

when the second voltage is greater than the first voltage at the fourth time, connecting the third reference potential to the third terminal of the second capacitor; and, after connecting the third reference potential to the third terminal of the second capacitor, selectively connecting the fourth reference potential to the third terminal of the second capacitor, wherein the first reference potential is approximately equal to the second reference potential, and wherein the third reference potential is approximately equal to the fourth reference potential.

17. The method of claim 11 wherein the first and second capacitors provide a radix of less than 2.

18. The method of claim 11 wherein the first and second capacitors are non-binary weighted.

19. The method of claim 11 wherein the first and second capacitors are binary weighted.

20. The method of claim 11 further comprising selectively connecting the first, second, third, and fourth reference potentials to input terminals of N additional capacitors of the DAC,
   wherein output terminals of the N additional capacitors are connected to the common node of the DAC, and
   wherein N is an integer greater than zero.

* * * * *